United States Patent [19]
Maegawa et al.

[11] Patent Number: 5,438,601
[45] Date of Patent: Aug. 1, 1995

[54] REFERENCE CLOCK FREQUENCY DIVIDER

[75] Inventors: Hiroshi Maegawa, Yokohama; Toshihiro Shigemori, Sagamihara; Yuichi Kadokawa, Tokyo, all of Japan

[73] Assignee: Ricoh Company Ltd., Tokyo, Japan

[21] Appl. No.: 311,144

[22] Filed: Sep. 23, 1994

[30] Foreign Application Priority Data

Sep. 25, 1993 [JP] Japan .................................. 5-261701

[51] Int. Cl.$^6$ ............................................ H03K 21/00
[52] U.S. Cl. ........................................ 377/48; 377/49
[58] Field of Search ...................................... 377/48, 49

[56] References Cited
U.S. PATENT DOCUMENTS

| | | | |
|---|---|---|---|
| 4,704,723 | 11/1987 | Markland | 377/49 |
| 4,991,188 | 2/1991 | Perkins | 377/49 |
| 5,222,111 | 6/1993 | Muramatsu | 377/49 |
| 5,255,213 | 10/1993 | Wasserman | 377/49 |

FOREIGN PATENT DOCUMENTS 405048436 2/1993 Japan .................................. 377/49

*Primary Examiner*—Margaret Rose Wambach
*Attorney, Agent, or Firm*—Cooper & Dunham

[57] ABSTRACT

A reference clock frequency divider feasible for a motor drive IC (Integrated Circuit), optical disk drive, hard disk drive or similar apparatus. The frequency divider is capable of setting not only integral frequency division ratios but also decimal frequency division ratios without any circuit modification.

9 Claims, 15 Drawing Sheets

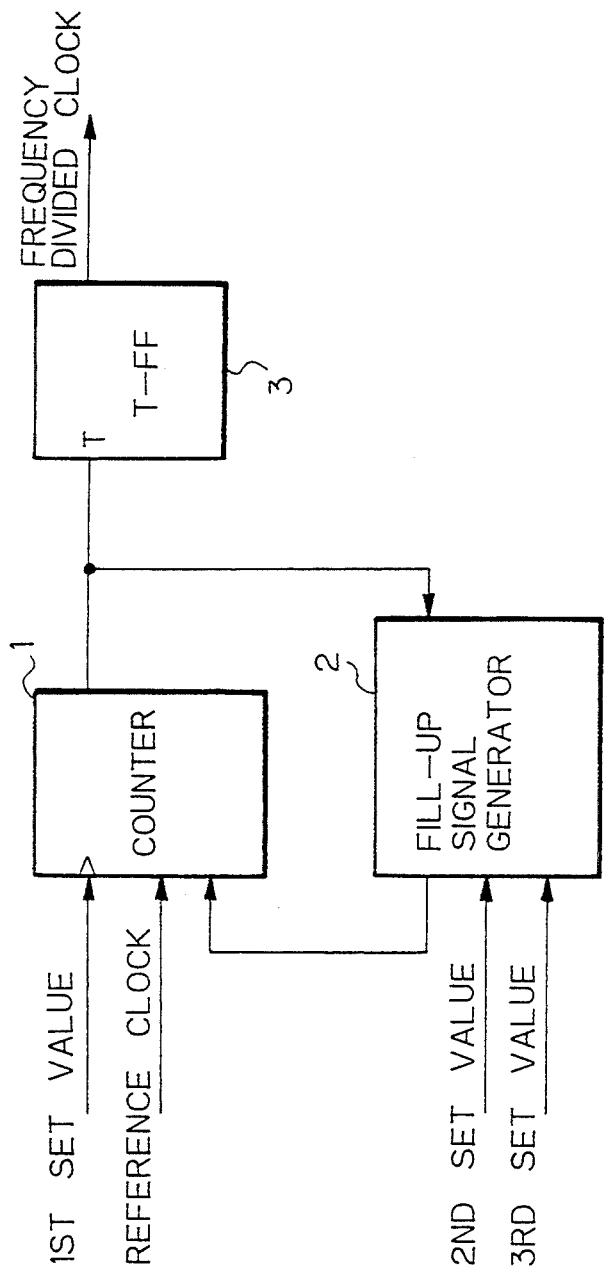

| MEDIA SIZE (inch) | SECTOR SIZE (byte/sector) | SPEED (rpm) | DATA CLOCK FREQUENCY (MHz) | REQUIRED PULSES FOR 1 ROTATION |
|---|---|---|---|---|
| 3.5" | 512 | 1,800 | 8.7 | 290,000 |
| | | 3,000 | 14.5 | |
| | | 3,600 | 17.4 | |
| 5.25" | 512 | 1,800 | 11.10048 | 370,016 |
| | | 3,600 | 22.20096 | |
| | 1,024 | 1,800 | 11.0976 | 369,920 |
| | | 3,600 | 22.1952 | |

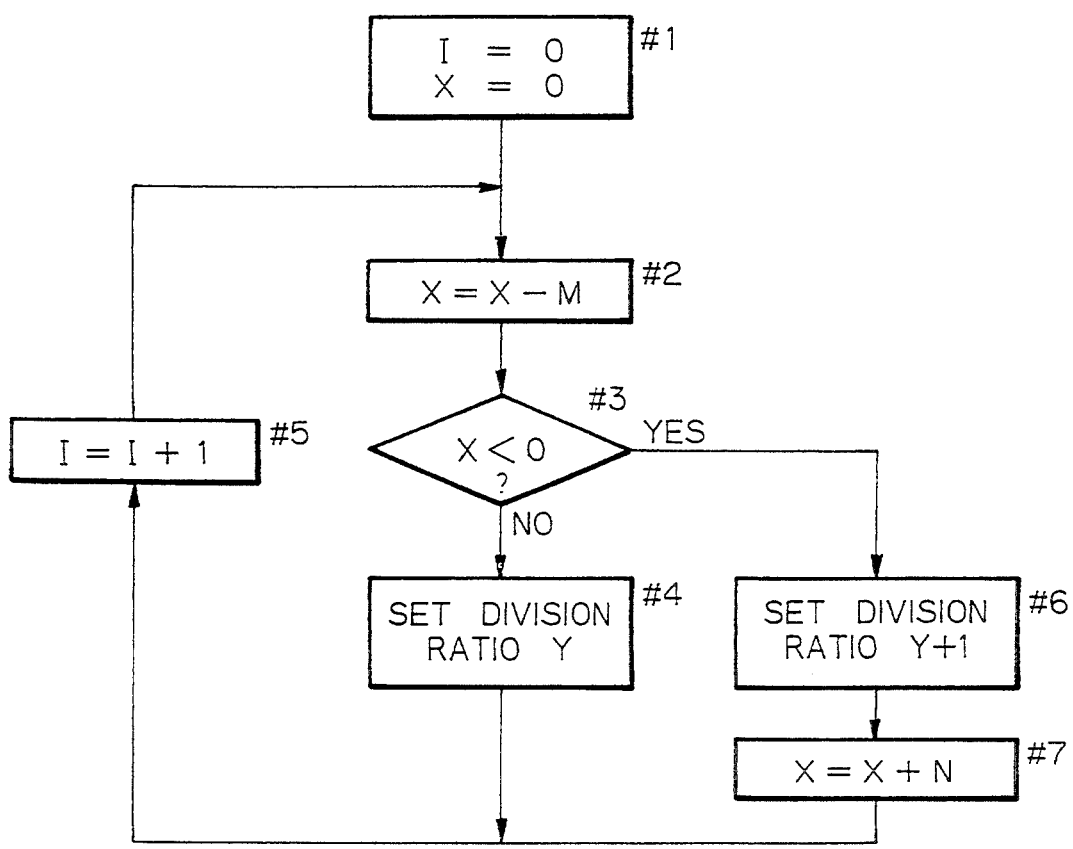

Fig. 7

| PULSE NO. (I) | 1 2 3 4 5 6 7 | 8 9 10 11 12 13 14 | 15 16 17 18 19 20 21 | 22 23 24 25 26 27 28 | 29 30 31 32 33 34 35 |
|---|---|---|---|---|---|
| NUMBER OF LOOPS | 1 | 2 | 3 | 4 | 5 |
| NUMBER OF CALCULATIONS | 0 1 2 3 4 5 6 | 0 1 2 3 4 5 6 | 0 1 2 3 4 5 6 | 0 1 2 3 4 5 6 | 0 1 2 3 4 5 6 |
| DIVISION RATIO | Y Y Y Y Y Y Y | Y Y Y Y Y Y Y | Y Y Y Y Y Y Y | Y Y Y Y Y Y Y | Y Y Y Y Y Y Y |
| DIVISION RATIO | Y+1 Y+1 | Y+1 Y+1 | Y+1 Y+1 | Y+1 Y+1 | Y+1 Y+1 |
| Y+1 PULSES/ TOTAL PULSES | 2/7 | 2/7 | 2/7 | 2/7 | 2/7 |

Fig. 12

| CALCULATION IN ADDER | CARRY OUT (CO) | SUBSEQUENT OPERATION | CARRY IN (CI) |
|---|---|---|---|
| $XL + \overline{ML} > FF$ | H | CARRY BY 1 WHEN $XH + \overline{MH}$ | H |
| $XH + \overline{MH} > FF$ | H | USUAL CALCULATION | L |
| $XL + NL > FF$ | H | CARRY BY 1 WHEN $XH + NH$ | H |
| $XH + NH > FF$ | H | USUAL CALCULATION | L |
| $XL + \overline{ML} \leq FF$ | L | OUTPUT $T_2$ FOR $Y+1$ DIVISION | L |
| $XH + \overline{MH} \leq FF$ | L | USUAL CALCULATION | L |
| $XL + NL \leq FF$ | L | USUAL CALCULATION | L |
| $XH + NH \leq FF$ | L | USUAL CALCULATION | L |

| SET PARAMETERS | SET VALUES | MAX ALLOWABLE VALUE |
|---|---|---|
| N´ | N/L | 65,535 |
| Y´ | $\overline{Y}$ | 255 |
| M´ | $\overline{M/L}$ | 65,535 |

REFERENCE CLOCK FREQUENCY DIVIDER

BACKGROUND OF THE INVENTION

The present invention relates to an improvement in or relating to a variable frequency divider capable of generating a desired frequency division ratio and, more particularly, to a reference clock frequency divider feasible for a motor drive IC (Integrated Circuit), optical disk drive, hard disk drive or similar apparatus. The frequency divider to which the present invention pertains is capable of setting not only integral ratios but also decimal ratios without any circuit modification.

It is a common practice with a frequency divider to cascade binary counters or decimal counters. This kind of configuration has a problem that frequency division ratios available therewith are limited to integers. Today, in parallel with the progress in technologies, apparatuses in general are diversifying and require circuitry which is more complicated and features more functions. A current trend in the art is, therefore, toward a frequency divider capable of generating a broad range of frequency division ratios. Such frequency dividers broaden the applicability of a single multi-function apparatus when installed therein. In practice, however, since only some of the frequency division ratios available in an apparatus are used often, many of frequency dividers built in the apparatus are often left unused.

As stated above, the conventional frequency divider, implemented by cascaded binary or decimal counters, cannot generate frequency division ratios other than integral ratios.

SUMMARY OF THE INVENTION

It is, therefore, an object of the present invention to provide a reference clock frequency divider capable of eliminating the problem with the conventional frequency divider that frequency division ratios other than integral ratios cannot be generated.

It is another object of the present invention to provide a reference clock frequency divider capable of setting not only integral frequency division ratios but also decimal frequency division ratios.

In accordance with the present invention, a reference clock frequency divider for dividing the frequency of a reference clock on the basis of set values to thereby generate a frequency divided clock pulse comprises a counter for outputting the frequency divided clock pulse in response to a first set value and a fill-up signal, and a fill-up signal generator responsive to the frequency divided clock pulse and a second and a third set value for performing an arithmetic operation based on the second and third set values every time the frequency divided clock pulse appears, and for generating a fill-up signal in accordance with the result of the arithmetic operation. The counter divides, when the fill-up signal generator does not generate the fill-up signal, the frequency of the reference clock by the first set value or divides, when the fill-up signal generator generates the fill-up signal, the frequency of the reference clock by a value produced by adding 1 (one) to the first set value.

BRIEF DESCRIPTION OF DRAWINGS

The above and other objects, features and advantages of the present invention will become more apparent from the following detailed description taken with the accompanying drawings in which:

FIG. 1 is a block diagram schematically showing the basic construction of a reference clock frequency divider of the present invention;

FIG. 2 shows a specific procedure available with the present invention for filling up a fragmentary or odd frequency division ratio with a combination of integral values periodically and thereby setting up periodicity comparable with the odd ratio as a whole;

FIG. 5 is a flowchart demonstrating a major operation particular to the present invention;

FIG. 6 shows a specific operation of the present invention using numerical values;

FIG. 7 shows a relation between the number of (Y+1) divided pulses and the number of repeated arithmetic operations, frequency division ratios, and total number of pulses shown in FIG. 1 and which holds when a disk actually rotates one full rotation;

FIG. 12 is a table representing an arithmetic operation of an adder included in the third embodiment and the subsequent arithmetic operation;

DESCRIPTION OF THE PREFERRED EMBODIMENTS

Figures 3, 4:
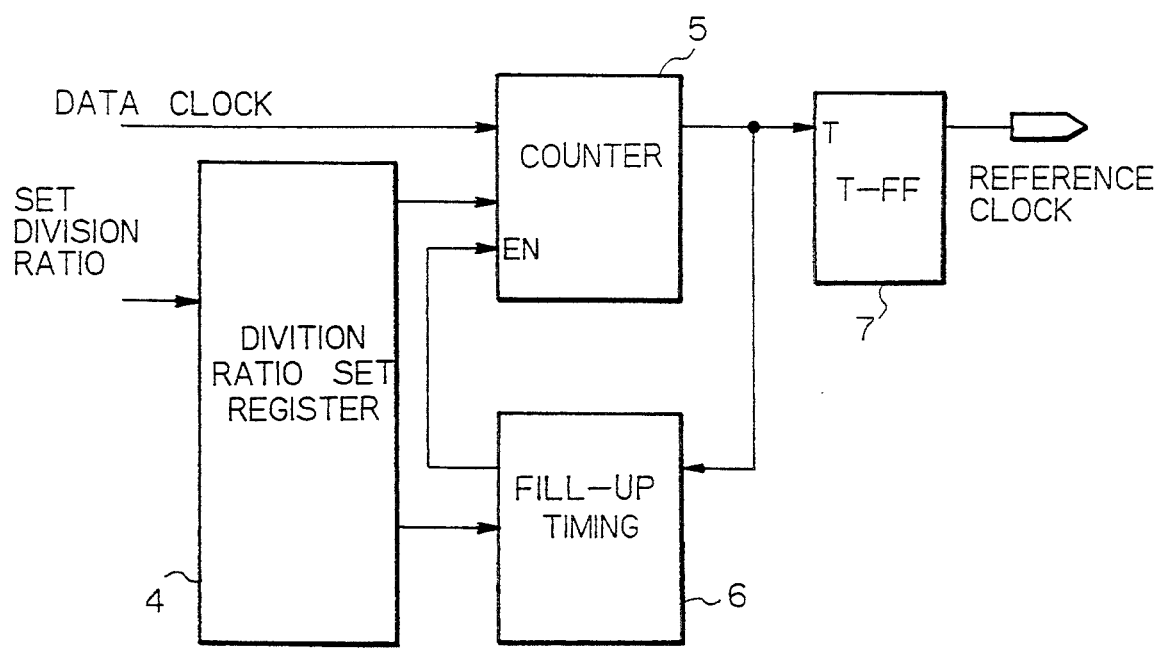
FIG. 3 is a table listing specific data clock frequencies and specific number of pulses necessary for one rotation of a medium with respect to 3.5" and 5.25" disks to which the present invention pertains.
FIG. 4 is a block diagram schematically showing a specific construction of the frequency divider of the present invention.

Briefly, a reference clock frequency divider of the present invention has a function of generating two different integral frequency division ratios (Y and Y+1). The frequency divider combines the two frequency division ratios in a variable ratio so as to fill up a fragmentary or odd portion, thereby generating a desired frequency division ratio. Stated another way, the present invention generates a desired odd frequency division ratio by combining Y frequency division and (Y+1) frequency division. This principle will be better understand in relation to the revolution of the earth around the sun.

Regarding the orbital motion of the earth, the revolution period (days) corresponds to an odd or fragmentary frequency division ratio determined by calculation. FIG. 2 demonstrates a specific procedure in which the frequency divider of the present invention fills up an odd frequency division ratio with the combination of integers, thereby establishing periodicity comparable with an odd frequency division ratio as a whole. The procedure of FIG. 2 is representative of the orbital motion of the earth. Although the period of the orbital motion is about 365.25 days, a deviation of about 0.25 day occurs in a year (365 days) since the unit of a year on calendar is an integer (natural number). Therefore, it is a common practice to consider four consecutive years as a unit, assign 365 days to each of three of the four years, and assign 366 days to the remaining one year (leap year). In this way, on calendar, fragments short of an integer (one day) are suitably combined into an integer (one day) so as to fill up the fragments.

The period of the orbital motion of the earth year on calendar are respectively comparable with the odd frequency division ratio and realizable integer of the frequency divider of the present invention. Specifically, assuming that the realizable integral frequency division ratio is "Y", then Y is 365 while (Y+1) is 366.

In a reference clock frequency divider, assume that the number of data clock pulses and the number of output pulses of a counter for one rotation of a disk are D and N, respectively. Then, the above-mentioned division ratio Y is produced by:

$$D \div N = Y \text{ residual } M \qquad \text{Eq. (1)}$$

The four numerical values D, N, Y and M may be expressed as:

$$D = (N-M) \times Y + M \times (Y+1) \qquad \text{Eq. (2)}$$

Physically, the above Eq. (2) indicates that a reference clock having a desired frequency division ratio (including a decimal ratio) is achievable if the data clock (DX) is divided by Y for the number of pulses corresponding to the difference between the number of counter output pulses N and the residual M (N−M) and divided by (Y+1) for the M pulses.

A simple example which will promote the understanding of the above algorithm is as follows. Assume that the number of data clock pulses D and the number of counter output pulses N for one rotation of a disk are 500 and 35, respectively. Then, according to the Eq. (1), $$500 \div 35 = 14 \text{ residual } 10$$

Hence, the frequency division ratio Y is 14, and the residual is 10.

At the same time, according to the Eq. (2), $$500 = (35-10) \times 14 + 10 \times 15$$

In this way, as to thirty-five counter output pulses (N) for one rotation of a disk, the data clock D is divided by 14(Y=14) for twenty five pulses (N−M=35−10) and divided by 15(14+1=Y+1) for ten pulses (M). As a result, a frequency divider having a decimal division ratio of 500/35=14.2 is obtained.

Summarizing the above procedure, a division ratio Y is set so as to determine a division ratio (integral portion) based on the data clock (DX), and then the number of counter outputs (N) for one rotation of a disk and a residual (M) are set to determine the ratio between Y division and (Y+1) division.

The reference clock frequency divider of the present invention or a motor drive control device implemented thereby produces a frequency division ratio which is a uniform mixture of Y division and (Y+1) division, paying attention to the above-discussed principle.

The background of the present invention, i.e., why non-integral frequency division ratios are necessary is as follows. The frequency of a reference clock and, therefore, the frequency division ratio depends on an LSI used, as stated earlier. This, coupled with the fact that the frequency division ratio is not always an integer, makes the algorithm and circuitry complicated.

Specific numerical values applicable to a frequency divider, to which the present invention pertains, will be described. The following description will concentrate on, by way of example, a frequency divider for generating a clock meant for a spindle motor drive LSI (referred to as a reference clock hereinafter) out of a data read/write (R/W) clock (data clock), i.e., a spindle prescaler as generally referred to.

A frequency divider or spindle prescaler can generate a broad range of frequencies. The data clock has a frequency of, for example, 8.7 MHz for a 3.5″ disk which spins at a speed of 1,800 rpm. Since the reference clock depends on the spindle motor drive LSI used, the frequency division ratio necessary for the prescaler varies over a broad range.

In light of the above, the present invention allows the frequency division ratio to be set in a programmable fashion in order to enhance the applicability of a prescaler, i.e., without regard to the kind of the spindle motor drive LSI. Let the frequency division ratio, which the spindle prescaler can set up, range from 6 to 510 by way of example. Why such a range is selected is that the minimum frequency division ratio is "6" due to limitations on circuit arrangement, while the ratio "510" can accommodate various kinds of spindle motor drive LSIs when it comes to 3.5″ disks. Of course, such a range of frequency division ratios is only illustrative and will be changed in matching relation to disks to be used.

FIG. 3 lists specific data clock frequencies and specific number of pulses necessary for one rotation with respect to a 3.5″ disk and a 5.25″ disk to which the present invention pertains. As shown, while the data clock depends on the kind of a drive, the number of pulses necessary for one rotation of a medium is determined by the format of the medium.

The frequency divider, or spindle prescaler, of the present invention divides the frequency of the data clock with a counter and a T-flip-flop, which will be described with reference to FIG. 1 later, so as to generate a reference clock having a desired frequency division ratio.

The frequency required of the reference clock will be described on the assumption that two different kinds of LSIs, i.e., a type A LSI (e.g., TA8453AF available from Toshiba) and a type B LSI (e.g., HA13481S available from Hitachi) are used as a spindle motor drive LSI for driving a 3.5″ disk at 1,800 rpm. In this case, the required frequency division ratio is odd. To begin with, the number of data clock pulses (D) for one rotation is produced by:

$$D = 16 \text{ (clock/byte)} \times 725 \text{ (byte/sector)} \times 25 \text{ (sector/rotation)} = 290{,}000 \text{ (clock/rotation)}.$$

For the type A LSI, the number of reference clock pulses (Nx) for one rotation is:

$$Nx = (3/4) \times FG \times 128 \times 20 \times 6 = 46{,}080 \text{ (clock/rotation)}$$

For the type B LSI, the number Nx is:

$$Nx = (P/2) \times (n/m) \times (I - 0.5) \text{ (clock/rotation)}$$

As for the type B LSI, assuming P=8, n=16, m=4, and I=2.048, Nx is produced by:

$$Nx = (8/2) \times (16/4) \times (2{,}048 - 0.5) = 4 \times 4 \times (2{,}047.5) = 32{,}760 \text{ (clock/rotation)}$$

Therefore, the frequency division ratio (D/Nx) for the type A LSI is:

$$290{,}000 \div 46{,}080 = 6.2934\ldots$$

For the type B LSI, assuming that P, n, m and I have the above specific values, the frequency division ratio is:

$$290{,}000 \div 32{,}760 = 8.8522\ldots$$

While these numerical values are only illustrative, it has been difficult to generate desired frequency division ratios, including odd ratios necessary for a spindle prescaler, by a conventional frequency divider.

Spindle prescalers in preferred embodiments to be described are designed for 3.5" disks (needing 290,000 pulses for one rotation). However, numerical values to appear hereinafter are merely illustrative. In accordance with the present invention, odd or fragmentary frequency division ratios (including decimal ratios) are achievable, whereby the applicable range is broadened. Hence, the present invention can adapt even to 5.25" disks (needing about 370,000 pulses for one rotation).

Preferred embodiments of the reference clock frequency divider in accordance with the present invention will be described hereinafter.

1st Embodiment

Referring to FIG. 1, a reference clock frequency divider embodying the present invention is shown and generally made up of a counter, a fill-up signal generator 2, and a T-flip-flop 3. As shown, the counter 1 receives a reference clock, a first set value, and a fill-up signal output from the fill-up signal generator 2. The fill-up signal generator 2 receives a second set value and a third set value. The first set value is the frequency division ratio Y described previously in relation to the Eqs. (1) and (2). The second and third set values are respectively the residual M and the number of counter output pulses N for one rotation of a disk.

The fill-up signal generator 2 generates a fill-up signal determined by the second set value (residual M) and third set value (number of counter output pulses N). When the fill-up signal generator 2 does not output a fill-up signal, the counter 1 divides the frequency of the reference clock by the first set value and feeds the output thereof to the T-flip-flop 3. When the fill-up signal generator 2 outputs a fill-up signal, the counter 1 divides the reference clock by the sum of the first set value and 1 (one) and delivers the output thereof to the T-flop-flop 3. In this manner, the T-flip-flop 3 outputs a reference clock selectively divided by the first, second and third set values. At this instant, by changing the count on the basis of the second and third set values, it is possible to combine different counts and thereby generate desired frequency division ratios including, apparent sense, decimal ratios.

As stated above, the fill-up signal generator 2 and counter 1 determine the ratio between Y division and (Y+1) division according to the Eq. (2). This successfully produces a clock signal having a frequency division ratio in which the two kinds of division are uniformly combined.

FIG. 4 shows the functional arrangement of the embodiment specifically. As shown, the frequency divider has a division ratio register 4, a counter 5, a fill-up timing section 6, and a T-flip-flop 7. A CPU (Central Processing Unit) not shown, sets a parameter indicative of a frequency division ratio in the division ratio register 4. The parameter is transferred from the register 4 to the fill-up timing section 6. In response, the timing section 6 generates a timing signal and delivers it to the counter 5 (terminal EN). As a result, the counter 5 changes the frequency division ratio periodically with the result that a fragmental frequency division ratio, which apparently is not integral, is set up.

By the above procedure, the reference clock frequency generator (spindle prescaler) shown in FIG. 4 generates a reference clock by dividing the frequency of the data clock input to the counter 5 in a desired division ratio.

When the reference clock is to be fed to a spindle motor drive LSI, Y division and (Y+1) division should preferably be uniformly mixed, as stated earlier. For this purpose, the reference clock frequency divider, e.g., spindle prescaler shown in FIG. 4 is provided with the following additional arithmetic functions. The arithmetic functions will be described with reference to FIG. 5.

In FIG. 5, I and X respectively represent an output pulse RCO number as counted from the time of resetting and the output of an arithmetic section (adder). As shown, when the frequency divider is reset, I=0 and X =0 are set up (step #1). Every time a counter output RCO pulse appears, X=X−M is executed (step #2). Here, M is a residual produced by the Eq. (1).

Subsequently, whether or not X<0, i.e., whether or not the the counter output RCO pulse is positive is determined (step #3). If the answer of the step #3 is negative, NO, a frequency division ratio Y derived from a data clock is set (step #4). After the step #4, I=I+1 is performed (step #5). Specifically, when X is greater than or equal to zero, the pulse of the next "I+1" counter output RCO pulse is directly output under Y division. In contrast, when X is smaller than zero, a frequency division ratio (Y+1) is set (step #6), and then X=X+N is performed (step #7). Here, N is the number of counter output RCO pulses for one rotation included in the Eq. (1). Specifically, when X is smaller than zero, the step #5 is executed after (Y+1) has been set. It follows that the pulse of the next "I+1" counter output RCO pulse is extended by a single data clock pulse and subjected to (Y+1) division; X=X+N is performed.

The arithmetic functions represented by the steps #1 to #7 are added to the reference clock frequency divider (spindle prescaler).

FIG. 6 shows a specific operation of the embodiment. In the figure, there are shown counter output pulse RCO numbers "I" ranging from 0 to 7 as counted from the time of resetting, and the calculations included in FIG. 5 (steps #2 and #7) for each of the numbers 0 to 7. Specifically, the values X (=X−M) derived from the differences between the results of calculation X and residuals M (step #2) are listed at the left-hand side, while the values X=X+N and associated frequency division ratios (Y=14) (step #7) are listed at the right-hand side. Further, the results of decision in the step #3 of FIG. 5 (X<0) are shown at the center of the figure.

As FIG. 6 indicates, at the RCO output pulse number (I) 7, X at the left end of the list returns to zero, resulting in the same condition as with I=0. Hence, the seven steps corresponding to I's of 0 to 6 (referred to as a loop hereinafter) are repeated.

In FIG. 6, among the seven steps, two have the frequency division ratio (Y+1) while five have the frequency division ratio Y. For the counter output RCO pulse "1=35", I's of 0 to 6 shown in FIG. 6 are repeated five times; the ratio (Y+1) and the ratio Y occur ten times and twenty-five times, respectively. Since the frequency division ratio Y is 14 as determined by the Eq. (2), the data clock divided by 14 (ratio Y) are output as twenty-five output RCO pulses while the data clock divided by 15 (ratio (Y+1)) are output as ten output RCO pulses.

Regarding the results of arithmetic operations listed in FIG. 6, the ratio between the division ratios Y and (Y+1) will be discussed with reference to the entire view shown in FIG. 7. FIG. 7 shows how Y division and (Y+1) division are combined when a disk actually rotates one full rotation (the loop of I=0 to 7, FIG. 6, is repeated five times).

Specifically, FIG. 7 shows a relation between how many times the loop of FIG. 5 is repeated, the frequency division ratio, and the ratio of the number of (Y+1) division pulses to the total number of pulses to hold when a disk rotates one full rotation. As shown, the total number of pulses is thirty-five, and each is designated by a pulse number I ranging from 1 to 35. The frequencies of loop 1 to 5 (corresponding to I=0 to 6 of FIG. 6) are respectively associated with the pulse numbers 1–7, 8–14, 15–21, 22–28, and 29–35. How many times the arithmetic operation is repeated (0 to 6) and the Y and (Y+1) division ratios are shown below the frequencies of loop.

As shown in FIG. 7, the (Y+1) division pulse is generated twice in every loop (1 to 5); ten of the thirty-five pulses in total are the (Y+1) division pulses. At the same time, FIG. 7 proves the results of operation described in relation to FIG. 6, i.e., the data clock is divided by 14 for twenty-five pulses (35−10=25 and divided by 15 for ten pulses..

As stated above, the illustrative embodiment is capable of generating even a reference clock whose division ratio is not an integer accurately.

2nd Embodiment

How the reference clock frequency divider of the present invention is constructed and operated has been described in detail with reference to FIG. 5. In actual circuit design, however, it is more practical to replace "M" included in "X=X−M" (step #2, FIG. 5)" with an M's complement and add it to X. To begin with, the construction and operation of the division ratio generating section included in the frequency divider of FIG. 4 will be described specifically.

Figure 8:
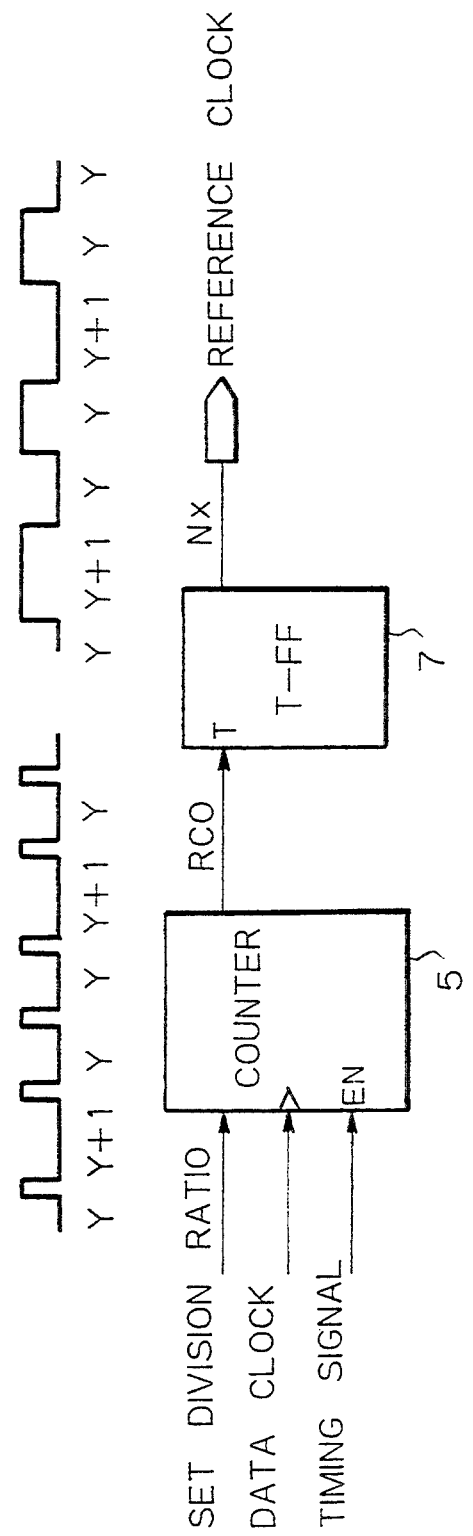
FIG. 8 is a block diagram schematically showing a specific construction of a frequency division ratio generating section included in the frequency divider of the present invention.

FIG. 8 shows a division ratio generating section which generates a reference clock by dividing the frequency of a data clock. In FIG. 8, the same or similar constituents as the constituents shown in FIG. 4 are designated by the same reference numerals; DX is a data clock, RCO is a counter output in which Y division and (Y+1) division are uniformly combined, and Nx is the number of reference clock pulses to appear for one rotation. As shown, when the division ratio Y is set on the counter 5 and a data clock DX is applied to the counter 5, the counter 5 produces a counter output RCO in which the Y division and (Y+1) division of the data clock DX are uniformly mixed. As such a counter output RCO is applied to the terminal T of the T-flip-flop 7, the flip-flop 7 produces a reference clock divided in frequency by 2 and close to a duty ratio of 50%. Specifically, the number of counter output RCO pulses (N) and the number of reference clock pulses (Nx) for one rotation have the following relation:

$$N = 2 \times (Nx). \qquad \text{Eq. (3)}$$

In FIG. 8, it is the counter that controls the division ratio to Y or (Y+1). The reference clock has a frequency which is one half of the frequency of the counter output ROC signal (pulses).

In light of this, to simplify the algorithm for division ratio setting, the reference clock will be replaced with the counter output RCO signal in the following description.

The algorithm of the reference clock frequency divider of the present invention has been described previously, using the Eqs. (1) and (2). The second embodiment of the present invention is characterized in that in the equation X=X−M (step #2, FIG. 5), M is replaced with an M's complement and then added to X.

Figure 9:
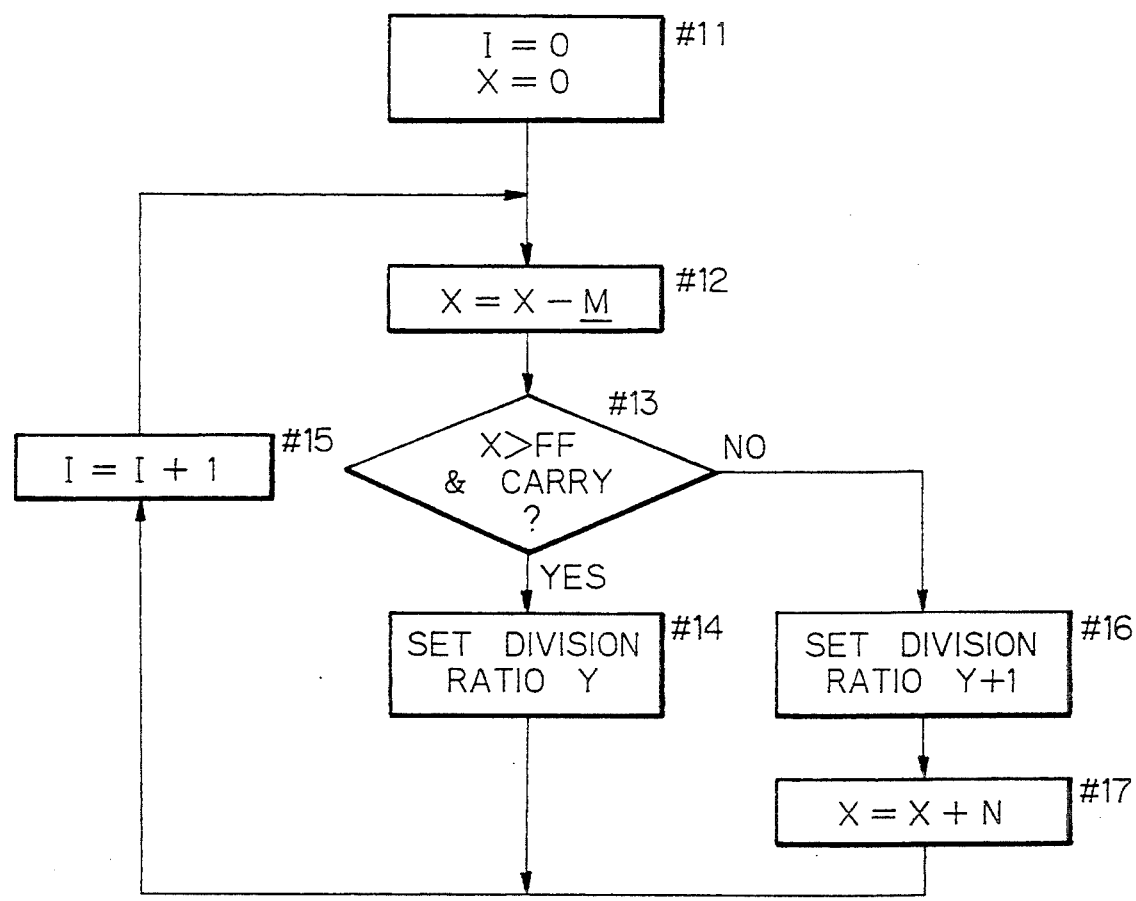
FIG. 9 is a flowchart representative of a second embodiment of the present invention.

FIG. 9 shows a specific operation of the second embodiment. The procedure of FIG. 9 is essentially similar to the procedure of FIG. 5 except for steps #12 and #13. In the step #12, the M's complement <<M>> is representative of a complement of the residual M included in the Eq. (1).

In the specification, the M's complement is represented by <<M>> and, therefore, different from the representation in FIG. 9. In the step #13, a decision "X>FF?" is substituted for the decision "X<0?" in the step #3, FIG. 5, for thereby determining whether or not a carry has occurred. The rest of the procedure is essentially the same as in FIG. 5. When the frequency divider is reset, I=0 and X=0 are set up (step #11). Every time a counter output RCO pulse appears, X=X+<<M>> is performed. In the flowchart, X=X+<<M>> is performed (step #12).

In the next step #13, whether or not X>FF is determined to see if a carry has occurred in the adder. If the answer of the step #13 is positive, meaning that a carry has occurred, the division ratio Y is set (step #14), and then a step #15 is executed. Specifically, when X is greater than FF, the next "1+1" counter output RCO pulse is directly output under Y division. In contrast, if X is smaller than or equal to FF, meaning that a carry has not occurred in the adder, a step #16 is executed.

After the division ratio (Y+1) has been set in the step #16, X=X+N is performed (step #17); N is the number of output RCO pulses for one rotation in the Eq. (1). Hence, when X is smaller than or equal to FF, the processing for extending the next "1+1" counter output RCO pulse by one data clock pulse and dividing it by (Y+1) and the X=X+N operation are executed at the same time.

The arithmetic functions represented by the steps #11 to #17 are included in the reference clock frequency divider (spindle prescaler), thereby implementing division ratios including decimal ratios. In addition, the illustrative embodiment promotes easier and more practical circuit arrangement than the first embodiment.

3rd Embodiment

The basic circuit arrangement including the arithmetic functions has been described in detail with reference to FIGS. 1 and 4. Another specific arrangement will be described as a third embodiment.

Figure 10:
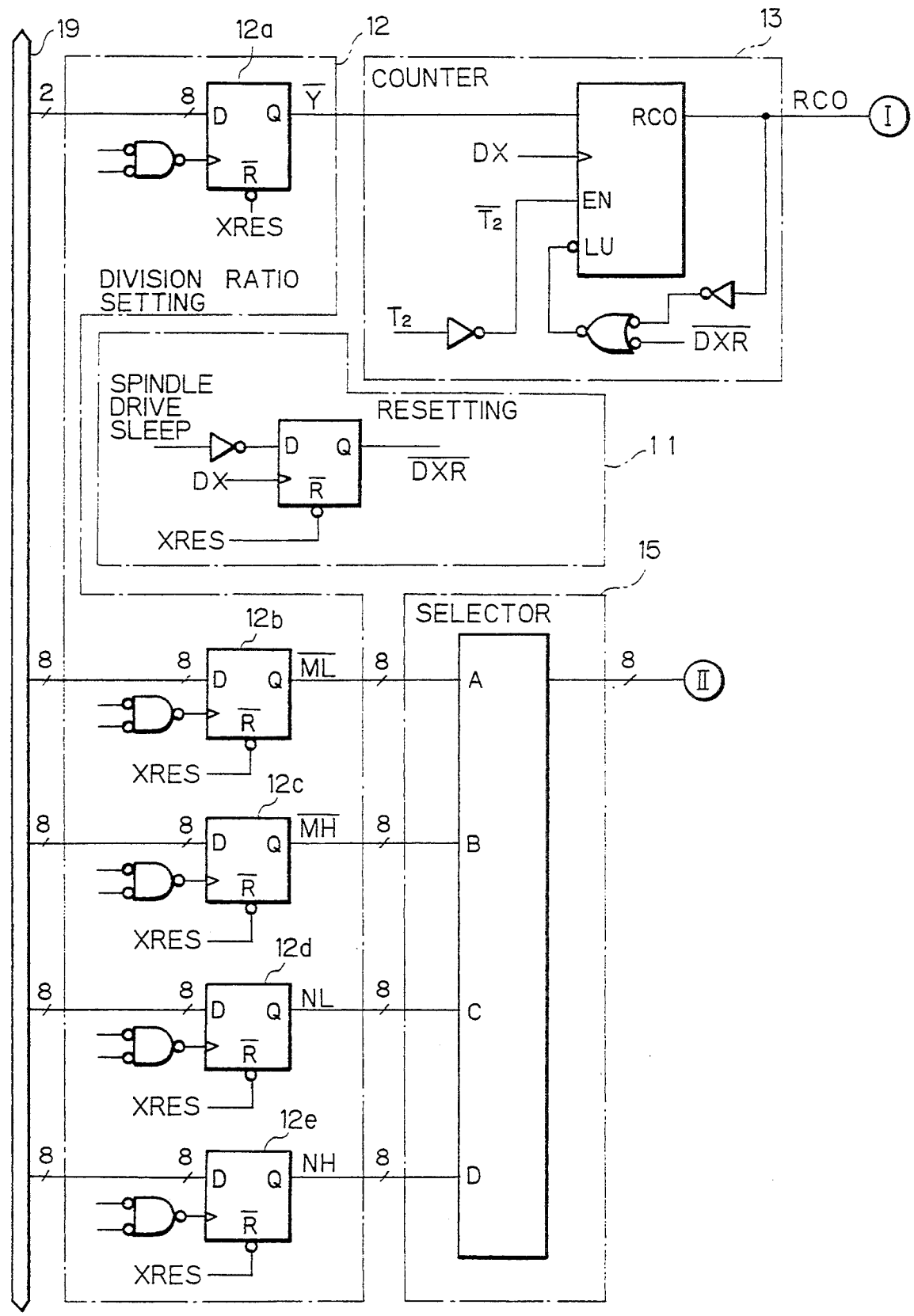
FIGS. 10 and 11 are a schematic block diagram showing, in combination, a third embodiment of the present invention.
Figure 11:
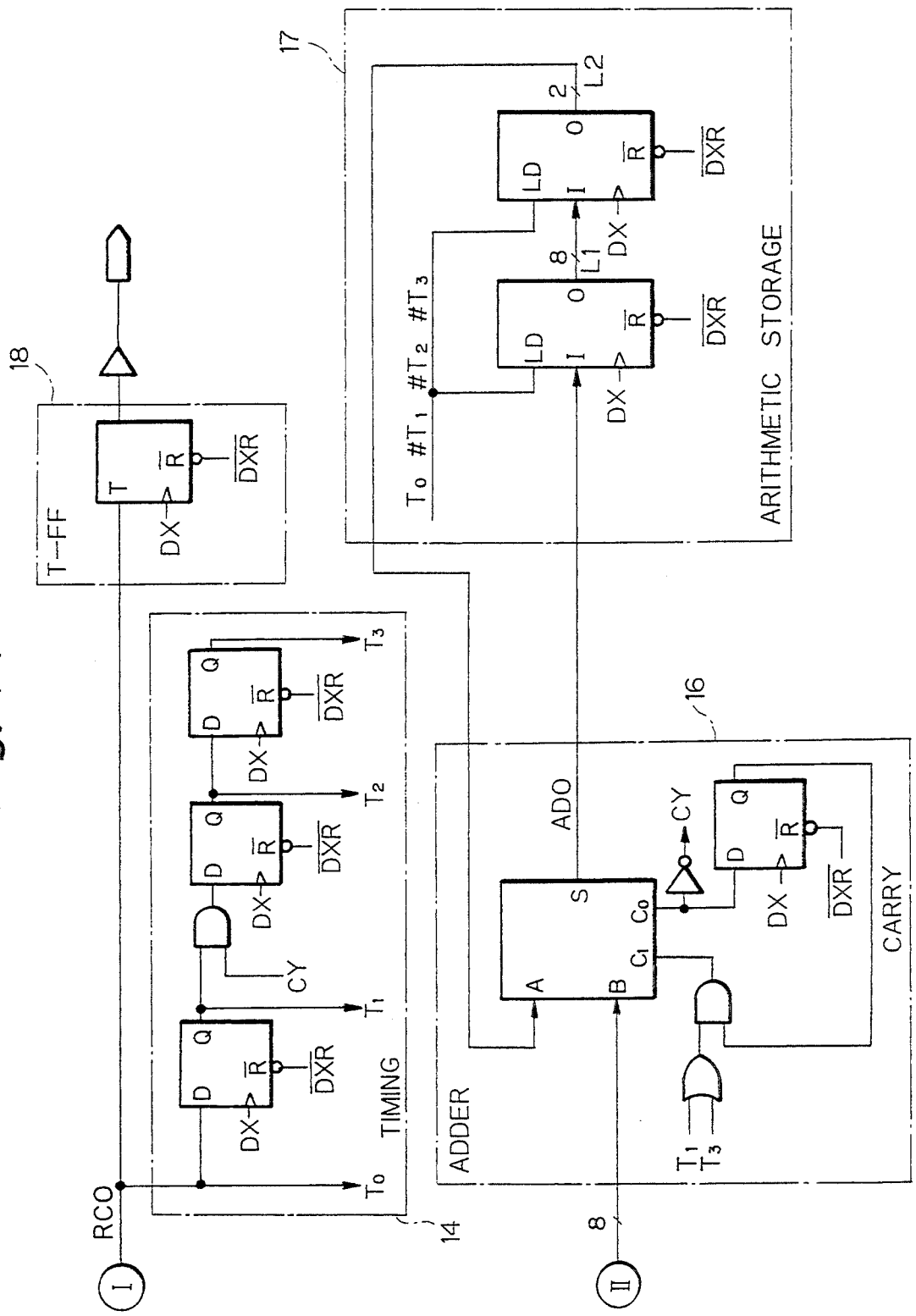

FIGS. 10 and 11 show the essential part of this embodiment. As shown, the frequency divider has a resetting section 11, a division ratio setting section 12, a counter 13, a timing section 14, a selector 15, an adder 16, an arithmetic storage 17, a T-flip-flop 18, and a system bus 19. Signals to appear in this circuitry are the same as the signals shown in FIG. 4. Labels I and II indicate how FIGS. 10 and 11 should be combined.

The signals in FIGS. 10 and 11 each has a particular waveform which will be described with reference to FIG. 15. Specifically, the following signals appear in the circuitry:

DX: data clock
<<DXR>>: reset signal for spindle prescaler
$T_0$: select signal for selector A
$T_1$: select signal for selector B
$T_2$: select signal for selector C
$T_3$: select signal for selector D
L1, L2: arithmetic result in storage 17
ADO(X): arithmetic result in adder 16
RCO: output of counter 13
CY: carry signal
CI: carry in The functions of the constituents shown in FIGS. 10 and 11 will be outlined. The resetting section 11 generates a reset signal to be applied to registers included in the spindle prescaler. A CPU, not shown, feeds a reset signal and a spindle sleep signal, which is a power saving feature, to the resetting section 11. The resetting section 11 is reset asynchronously and set synchronously.

The division ratio setting section 12 is implemented by registers (storages) 12a–12e for storing parameters for division ratio setting which are also applied from the CPU. Again, the Y's and M's complements (2's complements) respectively represented by <<Y>> and <<M>> for convenience and, therefore, different from the representation in FIG. 10. The storage 12a is a register for storing the Y's complement (2's complement), i.e., a <<Y>> register for storing an eight-bit frequency division ratio. The storage 12b is a register for storing the lower eight bits of the residual (M) of the Eq. (2); in this case, it is an <<ML>> register for storing the complement thereof (2's complement). The storage 12c is a register for storing the higher eight bits of the residual (M) of the Eq. (2), i.e., an <<MH>> register for storing the complement thereof. The storage 12d is an NL register for storing the lower eight bits of the number of counter output RCO pulses for one rotation. Further, the storage 12e is an NH register for storing the higher eight bits of the number of counter output RCO pulses for one rotation.

The counter 13 is implemented as an eight-bit synchronous load counter clocked by an 8.7 MHz data clock (DX). In the event of resetting and of RCO input, the counter 13 is loaded with a division ratio written to the storage, or <<Y>> register, 12a. While the counter 13 usually operates in the Y division condition, the Y division is replaced with the (Y+1) division on the entry of the signal $T_2$ (one clock pulse). The timing section 14 is comprised of a group of D-flip-flops also clocked by the 8.7 MHz data clock (DX). By sequentially delaying the output RCO (TO) of the counter 13 by one bit, the timing section 14 outputs the select signals $T_1$, $T_2$ and $T_3$, as will be described with reference to FIG. 14 later. It is to be noted that the signals $T_2$ and $T_3$ appear only when the arithmetic result in the adder 16 on the input of the signal $T_1$ is XL+<<MH>><FF and a carry signal CY goes high. The signal $T_2$ sets the division ratio (Y+1) on the counter 13. Here, XL represents the complement <<M>> of the residual M produced in the adder 16 or the arithmetic result of the lower eight bits of N.

The selector 15 selects, in response to the signals ($T_0$, $T_1$, $T_2$ and $T_3$) from the timing section 14, <<M>>, <<MH>>, NL or NH and feeds it to the adder 16. The adder 16 has an eight-bit adding section at the center and adds the output of the load register L2 (i.e., XL or XH) and <<ML>>, <<MH>>, NL or NH.

FIG. 12 lists the arithmetic operation of the adder 16 and the operation to follow it. Specifically, FIG. 12 shows the arithmetic operation of the adder 16 in the leftmost column, whether or not a carry out (CO) occurs in the second column, the following arithmetic operation of the adder 16 in the third column, and the carry in (CI) in the rightmost column. The upper four rows in FIG. 12 represent conditions wherein a carry out (CO) occurs and the output is in a high level or "H"; the lower four rows represent conditions wherein a carry out (CO) does not occur and the output is in a low level or "L". Based on such arithmetic results, the next arithmetic operations occur, as listed at the right-hand side. For example, on the uppermost row, "XL+<<ML>>>FF" in the rightmost column is performed, and the carry out CO is "H". This is followed by "XH+<<MH>>" in which "1" is carried; the carry in CI is "H". On the next row, "XH+<<MH>>>FF" is performed, and the carry out CO is "H". In this case, the usual operation is performed, and the carry in CI is "L". In the following description, let the result of operation of the adder 16 shown in FIG. 12 be represented by "X".

The arithmetic storage 17 stores the output of the adder 16 and has a loading function. For example, this storage 17 is comprised of two registers LI and L2 and stores the input signal when one of the signals $T_0$, $T_1$, $T_2$ and $T_3$ from the timing section 14 goes high. While the registers L1 and L2 store a new arithmetic result XL or XH alternately, they store XH and XL when all the signals $T_0$–$T_3$ are in a low level. The T-flip-flop 18 halves the frequency of the output signal (RCO) of the counter 13 to thereby produce a clock whose duty ratio is approximately 50%. The output of the flip-flop 18 is the reference clock.

The frequency divider or spindle prescaler of the embodiment has a programmable division ratio, as stated earlier in relation to the principle of the present invention. Parameters for programmable division ratio setting will be described in detail. To produce a reference clock by dividing the frequency of the data clock (DX), the following known values (or system parameters as referred to hereinafter) are available:

D: number of data clock pulses for one rotation
N: number of RCO pulses for one rotation By substituting D and N for the Eq. (1), there are produced a frequency division ratio (Y) and a residual (M).

Usually, the system parameters D and N and residual M each has an extremely great value. The equation, therefore, lacks simplicity. Moreover, D, N and M are apt to exceed the maximum allowable values for parameter setting. To eliminate these problems, the right and left members of the Eq. (2) are divided by the greatest common measure (L) of the system parameters D and N and residual M for thereby scaling them down. Let the values Y, M and L be referred to as intermediate parameters. The intermediate parameters Y, M and L are produced by:

$$(D/L) \div (N/L) = Y \text{ residual } (M/L) \qquad \text{Eq. (4)}$$

Figures 13, 14:
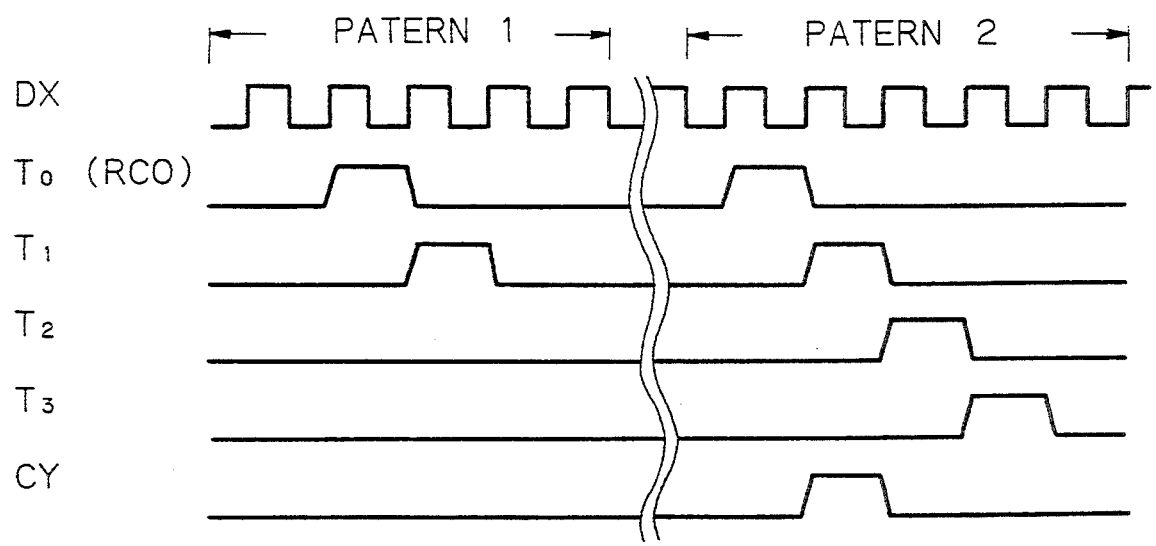
FIG. 13 is a table listing parameters to be set in the third embodiment.
FIG. 14 is a timing chart representing a specific operation of a timing section included in the third embodiment.

FIG. 13 is a table listing parameters for setting the frequency division ratio of the spindle prescaler and represented by the intermediate parameters Y, M and L and system parameters D and N. In the table, the parameters are defined as follows:

N': set number of RCO pulses N for one rotation
Y': set frequency division ratio
M': set residual
$<<Y>>$: Y's complement
$<<M/L>>$: M/L's complement As shown, the set values N/L ($=2 \times Nx/L$), $<<Y>>$ and $<<M/L>>$ are respectively given to the set parameters N', Y' and M', and the maximum allowable values (not represented by complements) are determined. Due to the particular circuitry of the spindle prescaler, the maximum allowable values of the set parameters are as follows (not represented by complements):

N': sixteen bits (0 to 65,535)
Y': eight bits (0 to 255)
M': sixteen bits (0 to 65,535)

Why sixteen bits are assigned to each of the set parameters N' and M' is that considering the reference clock of the spindle motor drive LSI of interest, sixteen bits is the minimum necessary number of bits when the greatest common measure (L) of the parameters is 2 (i.e., when Nx is the maximum greatest measure of D and N). Regarding the set parameter Y', eight bits are assigned since with such a number of bits most of the reference clocks for 3.5" disks and 5.25" disks can be generated.

The above-stated parameters are applied to a spindle motor drive LSI to be implemented by the reference clock frequency divider or spindle prescaler of the present invention. For example, as for the type A spindle motor drive LSI mentioned earlier (TA8453AF available from Toshiba), the set parameters are produced by the Eqs. (3), (1) and (4) on the assumption that a 3.5" disk spins at 1,800 rpm, and that the number of data clocks D for one rotation is 290,000.

For the type A spindle motor drive LSI, the number of reference clocks Nx for one rotation is prescribed as:

$$Nx = (\tfrac{3}{4}) \times FG \times 128 \; 20 \times 6$$

and FG is 4.

By substituting the above values for the Eq. (3), there is obtained:

$$N = 2 \times (Nx) = 2 \times 46{,}080 = 92{,}160$$

Also, according to the Eq. (1), $$Y = D \div N = 290{,}00 \div 92{,}160 = 3 \text{ residual } M = 13{,}520$$

Therefore, D is 290,000, N is 92, and M is 13,520. Since the greatest common measure L of D, N and M in Eq. (1) is 80, $$3{,}625 \div 1{,}152 = 3 \text{ residual } 169$$

As a result, the set parameters N', Y' and M' are respectively 1,152 (480h), 3 (FDh), and 169 (FF57h).

As for the type B (HA134845S available from Hitachi), the number of reference clocks Nx for one rotation is defined as:

$$Nx = (P/2) \times (n/m) \times (I - 0.5) = 32{,}760$$

where P is 8, n is 16, m is 4, and I is 2,048.

By substituting the above values for the Eqs. (1) and (3), there is obtained:

$$Y = D \div N = D \div 2 \times (Nx)$$

Since D is 290,000 and Nx is 32,760, $$Y = 290{,}000 \div (32{,}760 \times 2) = 4 \text{ residual } M = 27{,}920$$

As a result, D, N and M are respectively 290,000, 65,520 and 27,920. Since the greatest common measure L of D, N and M is 80, D=3,625, N=819 and M=349 are produced by division.

It follows that the set parameters for the type B are N'=819 (333h), Y'=4 (FCh), and M'=349 (FEA3h).

As stated above, with the reference clock frequency divider (spindle prescaler) of the present invention, it is possible to set even a decimal frequency division ratio by determining the parameters for frequency division setting. The operation of the frequency divider of the present invention may generally be classified into two procedures, i.e., a first procedure for dividing the data clock by Y and a second procedure for dividing it by (Y+1). These procedures are controlled by the signals $T_0$–$T_3$ output from the timing section 14, FIG. 11.

The timing section 14 included in the circuitry of FIGS. 10 and 11 will be described specifically. FIG. 14 is a timing chart representing the operation of the timing section 14. The former half, or pattern 1, of the timing chart corresponds to the above-mentioned first procedure, while the latter half or pattern 2 corresponds to the second procedure. There are shown in the figure the data clock DX, output signals $T_0$–$T_3$ of the timing section 14, and carry signal CY.

To begin with, in the pattern 1 or Y division, when the signal $T_0$ (counter output RCO) goes high for one data clock pulse, the signal $T_1$ goes high for one data clock pulse at the positive-going edge of the next data clock pulse DX. At this instant, if the output of the adder 16 is $X+<<MH>>>FF$, the carry signal CY remains in a low level. As a result, the signals $T_2$ and $T_3$ are not generated, and the timing section 14 awaits the next signal $T_0$.

In the second pattern for (Y+1) division, the signal $T_1$ goes high for one data clock pulse at the positive-going edge of the data clock pulse DX after the signal $T_0$ has gone high, as in the pattern 1. If the output of the adder 16 is $X+<<MH>>\leq FF$, the carry signal CY goes high. As a result, the signal $T_2$ goes high for one data clock pulse at the positive-going edge of the next data clock pulse DX, and the signal $T_3$ goes high for one data clock pulse at the positive-going edge of the following data clock pulse DX. Since the counter 13 is disenabled for one data clock pulse when the signal $T_2$ is in a high level, the frequency division ratio is (Y+1).

Figure 15A:
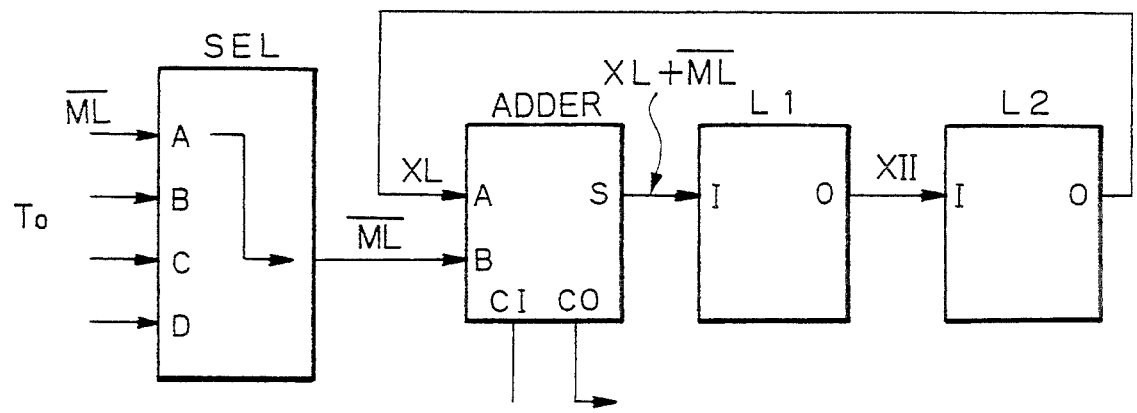
FIGS. 15A–15C demonstrate a first procedure particular to the third embodiment.
Figure 15B:
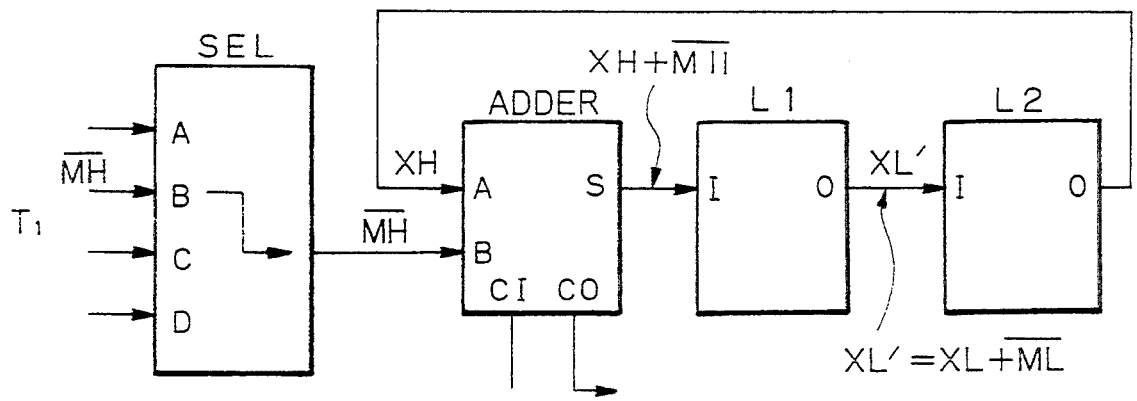
Figure 15C:
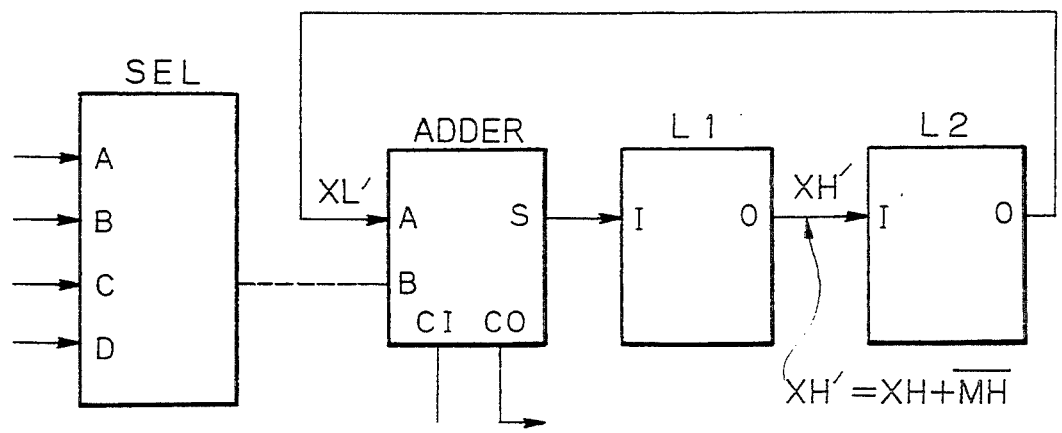

The first and second procedures outlined above will be described in detail. FIGS. 15A–15C demonstrate the first procedure to be executed by the frequency divider shown in FIGS. 10 and 11. Specifically, FIGS. 15A–15C respectively show a condition wherein the signal $T_0$ is output, a condition wherein the signal $T_1$ is output, and a condition wherein the signal $T_1$ is not followed by the signal $T_2$ or the like. Labels shown in FIGS. 15A–15C are the same as the labels of FIGS. 10 and 11; L1 and L2 designate load registers. Again, let the output of the adder 16 be represented by X. Since this procedure is executed by the selector 15, adder 16 and arithmetic storage 17, FIGS. 10 and 11, only the relevant part is shown in FIGS. 15A–15C. It is to be noted that this procedure is based on the flowchart shown in FIG. 9.

When the signal $T_0$ from the timing section 14, FIG. 11, arrives at the selector 15, the selector 15 selects the input on the input terminal A thereof, i.e., $<<ML>>$, as shown in FIG. 15A. The adder 16 adds the input $<<ML>>$ and the output XL of the load resistor L2 built in the storage 17. The addition $kX=XL+<<ML>>$ is performed in the step #12, FIG. 9. If X>FF, the carry out CO goes high. When the timing section 14 produces the signal $T_1$, the load registers L1 and L2 each updates the data, as shown in FIG. 15B. Specifically, the load resistors L1 and L2 output $XL'=XL+<<ML>>$ and XH, respectively. The selector 15 selects the input on the input terminal B thereof, i.e., $<<MH>>$. The adder 16 adds $<<ML>>$ and the output XH of the load register L2, thereby outputting $X=XH+<<MH>>$. Assume that the carry out CO has gone high for the result of the previous calculation $X=XL+<<ML>>$ associated with the signal $T_0$ of FIG. 15A. Then, in the event of the calculation $kX=XH+<<MH>>$ in FIG. 15B, the carry in CI is caused to go high to generate a carry signal. It follows that $X=XH+<<MH>>+1$ is performed when the carry out CO is in a high level.

Thereafter, when the timing section 14 generates no outputs, i.e., when the signal $T_2$ shown in FIG. 14 is not output after the signal $T_1$, the load registers L1 and L2 update their data at the positive-going edge of the next data clock pulse DX. Specifically, as shown in FIG. 15C, the load resistors L1 and L2 output $XH'=XH+<<MH>>$ and XL', respectively. In this condition, the circuitry awaits the next signal $T_0$ (counter output RCO).

As stated above, in the first procedure or pattern 1, the selector 15 selects $<<ML>>$ and $<<MH>>$, which are the complements of the residual M, alternately and feeds them to the input terminal B of the adder 16. Receiving the output XL or XH of the load register L2 on the terminal A, the adder 16 adds it to the input on the terminal B.

Figure 16A:
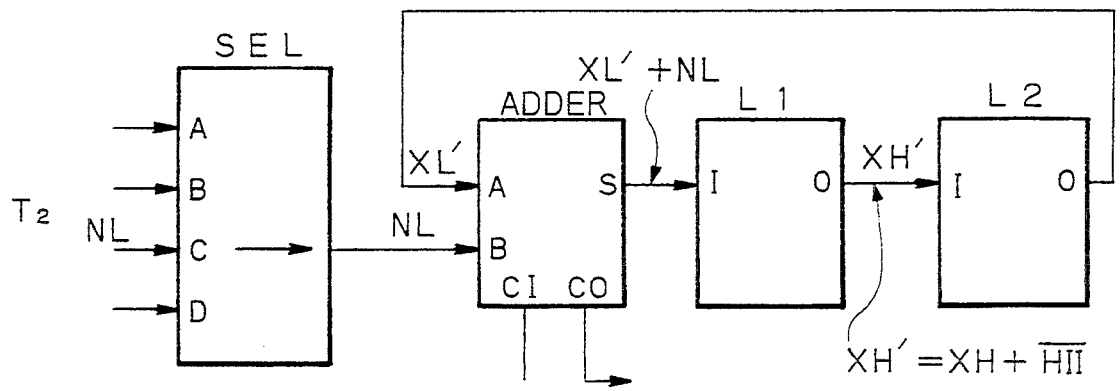
FIGS. 16A–16C demonstrate a second procedure also particular to the third embodiment.

The second procedure or pattern 2 will be described with reference to FIGS. 16A–16C which show conditions following the conditions of FIGS. 15A–15C, respectively. In the second procedure, as in the first procedure, the timing section 14 outputs the signals $T_0$ and $T_1$. In the first procedure, i.e., when the frequency division ratio is Y, the signal $T_2$ is not output after the operations of FIGS. 15A and 15B, as described in relation to FIG. 15C. In contrast, in the second procedure, the result of $X=XH+<<MH>>$ from the adder 16 shown in FIG. 15B is $X\leq FF$. Consequently, the carry out CO goes low. Hence, the carry CY goes high, and the signal $T_2$ goes high in response to the next data clock pulse DX. In this manner, when the frequency division ratio is (Y+1), the timing section 14 outputs the next signal $T_2$ at the end of the first procedure or pattern 1, as shown in FIG. 16A. As shown, the load registers L1 and L2 update their data at the positive-going edge of the data clock pulse DX, i.e., in response to the signal $T_2$. Specifically, the load registers L1 and L2 output $XH'=XH+<<MH>>$ and XL', respectively.

As shown in FIG. 16A, the selector 15 selects the input on the input terminal C thereof, i.e., NL. The adder 16 adds NL and the output XL' of the load register L2 to produce $X=XL'+NL$. If the result of addition X is greater than FF, the carry out CO goes high. Subsequently, the load registers L1 and L2 update their data at the positive-going edge of a data clock pulse DX associated with the next output $T_3$ of the timing section 14. As a result, the load registers L1 and L2 respectively output $XL''=XL'+NL$ and XH', as shown in FIG. 16B.

Figure 16B:
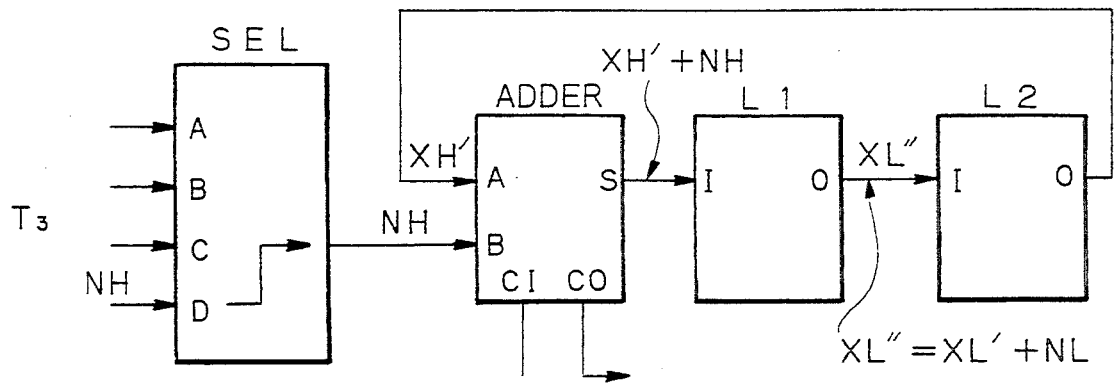
Figure 16C:
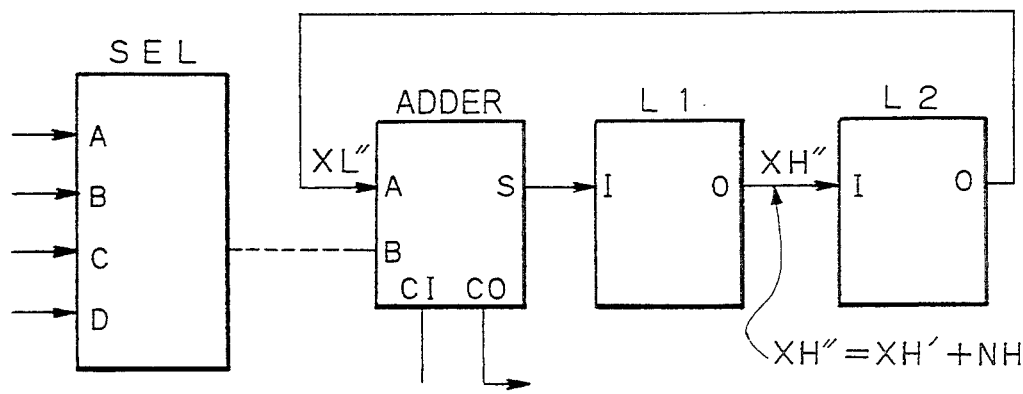

As shown in FIG. 16B, the selector 15 selects NH appearing on the input terminal D thereof. The adder 16 adds NH and the output XH' of the load register L2 to produces $X=XH'+NH$. At this instant, if the carry out CO has gone high for the result of the previous calculation, i.e., $X=XL'+NL$ derived from the signal $T_2$, the carry in CI is caused to go high in the event of the calculation $X=XH'+NH$. Specifically, $X=XH'+NH+1$ is performed.

The timing section 14 has a function of generating the signals $T_0$–$T_3$, as stated earlier. Hence, the next signal to appear in response to a data clock DX is T0; during this period of time, the timing section 14 does not produce any output. In this case, the load registers L1 and L2 update their data a t the positive-going edge of the next data clock pulse DX, as shown in FIG. 16C. Specifically, the load registers L1 and L2 output $XH''=XH'+NH$ and XL'', respectively. The selector 15 is disenabled with the result that no signals are applied to the input terminal B of the adder 16. In this condition, the circuitry awaits the next signal $T_0$ (counter output RCO).

As stated above, in the second procedure or pattern 2 for the division ratio (Y+1), the adder 16 performs an addition in response to each of the output signals $T_0$–$T_3$ of the timing section 14. As a result, a reference clock signal whose division ratio is (Y+1) is generated.

Figure 17:
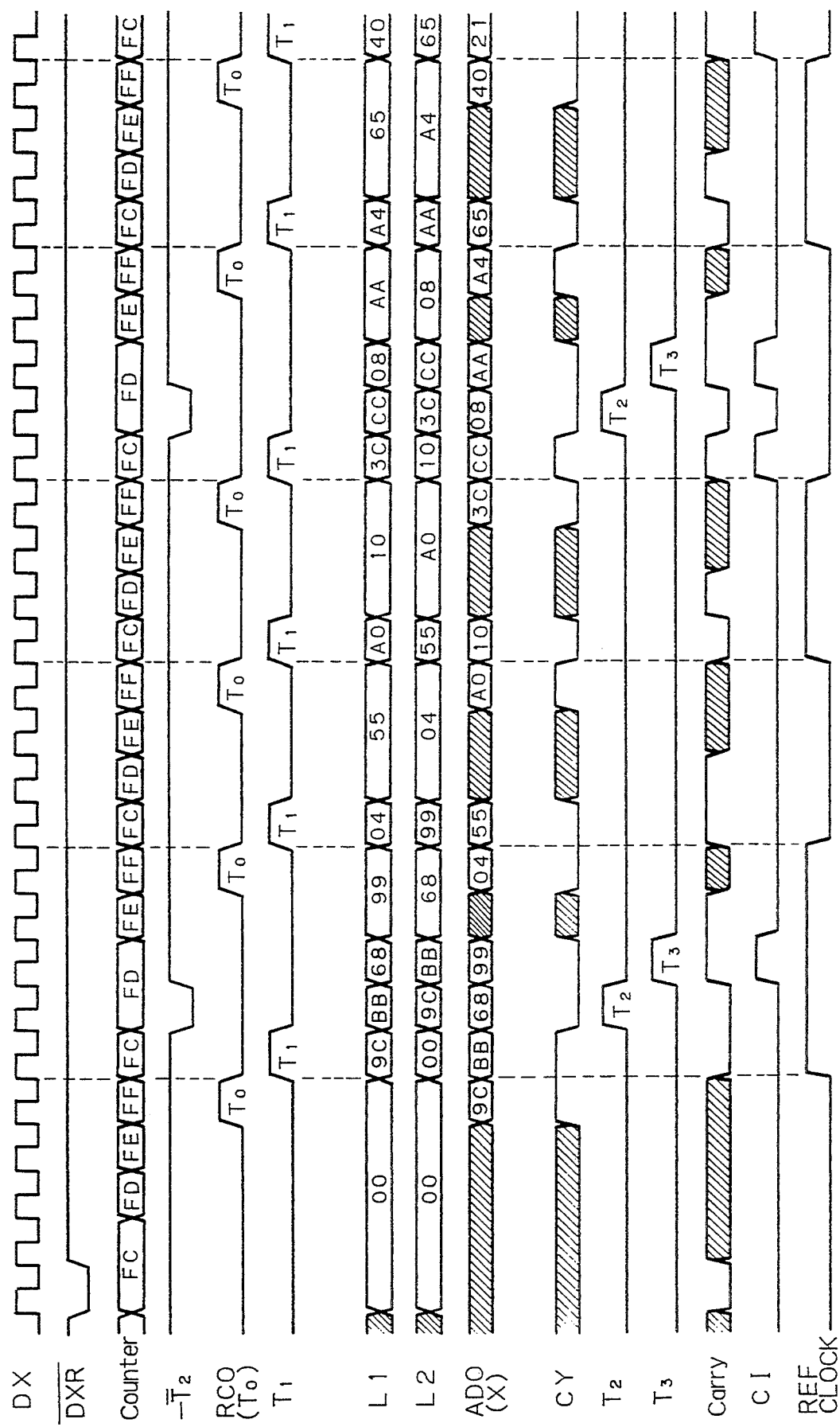
FIG. 17 is a timing chart showing the operation of the entire frequency divider shown in FIG. 4.

The operation of the entire reference clock frequency divider of FIG. 4 will be described with reference to FIG. 17. Labels attached to the signal waveforms correspond to the labels shown in FIGS. 10 and 11. To show the sequence of steps collectively, the data clock is assumed to have a frequency other than 8.7 MHz (290,000 for one rotation).

$$244,628 \div (2 \times 28,390) = 4 \text{ residual } 17,508$$

D=244,628
Nx=2×28,390
Y=4
M=17,508

4th Embodiment

While an embodiment to be described also implements the fill-up signal generator as an adder, it is characterized in that means is provided for monitoring the result of operation of the adder and thereby determining how many times it has coincided with a predetermined value.

Figure 18:
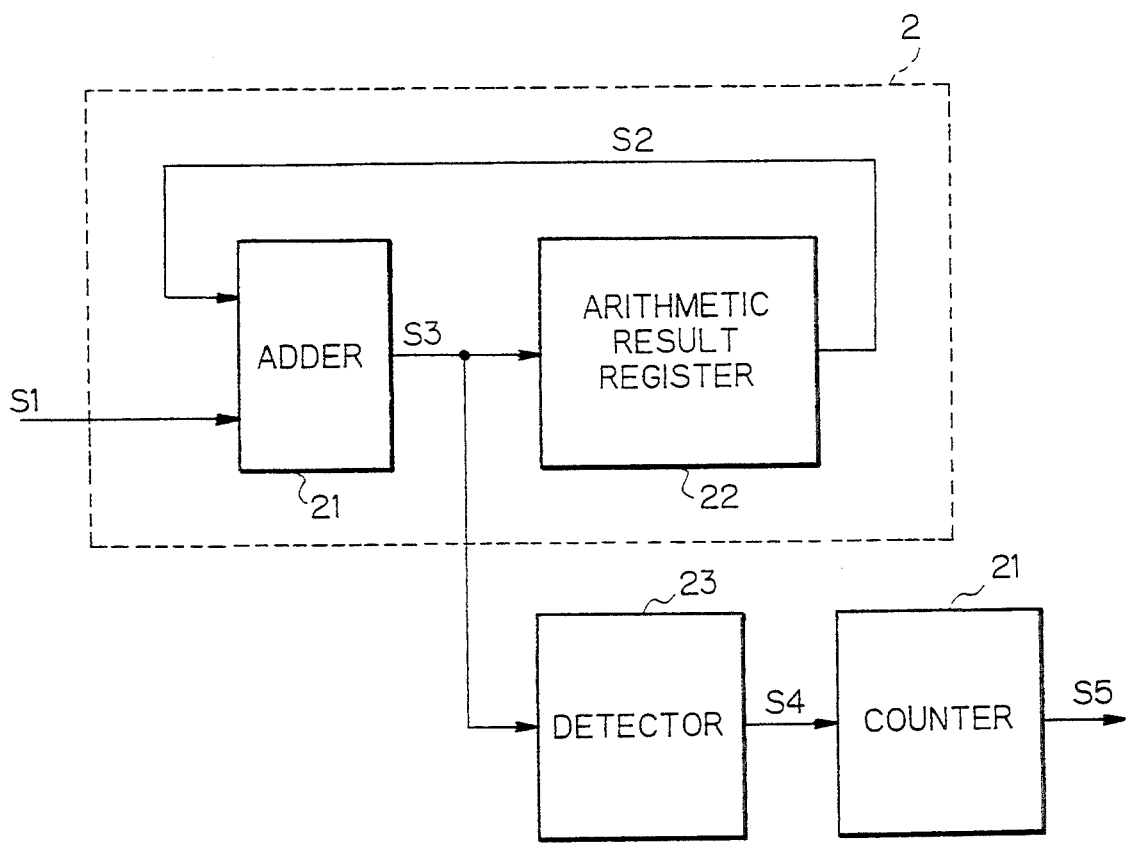
FIG. 18 is a block diagram schematically showing a specific construction of a loop detector included in the present invention.

FIG. 18 shows a specific construction of a section included in the embodiment for determining how many times the arithmetic loop has been repeated. In the figure, the labels are the same as those shown in FIG. 1. As shown, this section has an adder 21, an arithmetic result register 22, a detector 23, and a counter 24. Second and third set data S1 and previous result data S2 are applied to the adder 21. The adder 21 produces an output S3. The detector 23 outputs a detection signal S4 while the counter 24 produces data S5 representative of the frequency of the arithmetic loop.

Figure 19:
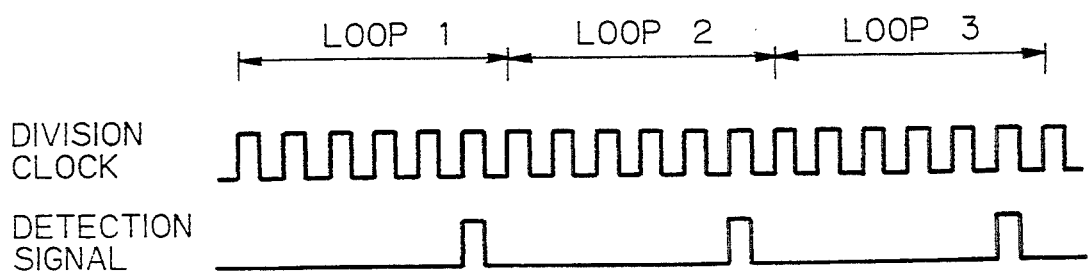
FIG. 19 is a tinning chart representative of a fourth embodiment of the present invention.

The adder 21 is included in the fill-up signal generator 2. The second and third set data S1 are applied to the adder 21 together with the data S2 representative of the result of the previous calculation and held in the register 22. In response to the output S3 of the adder 21, the detector 23 determines whether or not it is a predetermined value. If the answer of the decision is positive, the detector 23 outputs the detection signal S4. The counter 24 counts the detection signals S4 from the detector 23. As a result, the data S5 from the counter 24 indicates how many times the arithmetic loop has been repeated. FIG. 19 shows a frequency division clock and the detection signals S4.

As shown in FIG. 19, when the clock pulses output from the frequency divider are counted at the outside of the fill-up signal generator 2, it is necessary to count them by the counter 24 connected to the signal generator 2. In this case, since the detection signals S4 appear periodically relative to the frequency division clock, it is possible to reduce the number of bits of the counter 24 by using the detection signals S4 for counting or by counting the arithmetic loops. For example, assume that the frequency division clock generated by the embodiment is used to output one pulse for one rotation of a disk or medium. Then, assuming that the number of reference clock pulses for one rotation of the medium is D, that the number of output pulses of the frequency divider is N, that the integral portion of the frequency division ratio is Y, and that the number of residual pulses is M, they are related as represented by the Eq. (1), as stated earlier. The Eq. (2) is a modified form of the Eq. (1). Again, a desired frequency division ratio is attainable if the reference clock is divided in frequency by Y for (N−M)pulses and by (Y+1) for M pulses.

In the Eq. (2), the greatest common measure (L) of D, N and M indicates the number of arithmetic loops which should be executed for one rotation of a medium. Originally, to generate one pulse for one rotation of a medium, it is necessary to count the output clock of the frequency divider N times. However, a counter with a smaller number of bits can be implemented if the detection signals S4 from the detector 23 and the number of loops (L) for one rotation of the medium are counted.

5th Embodiment

Figure 20:
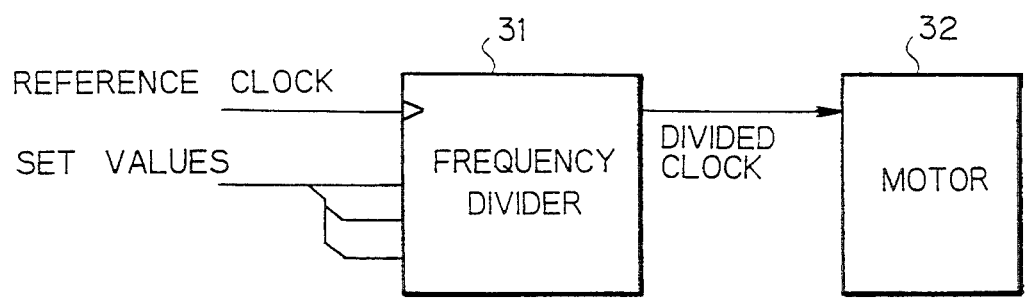
FIG. 20 is a block diagram schematically showing an arrangement wherein the fourth embodiment is implemented as a motor drive control device.
Figure 21:
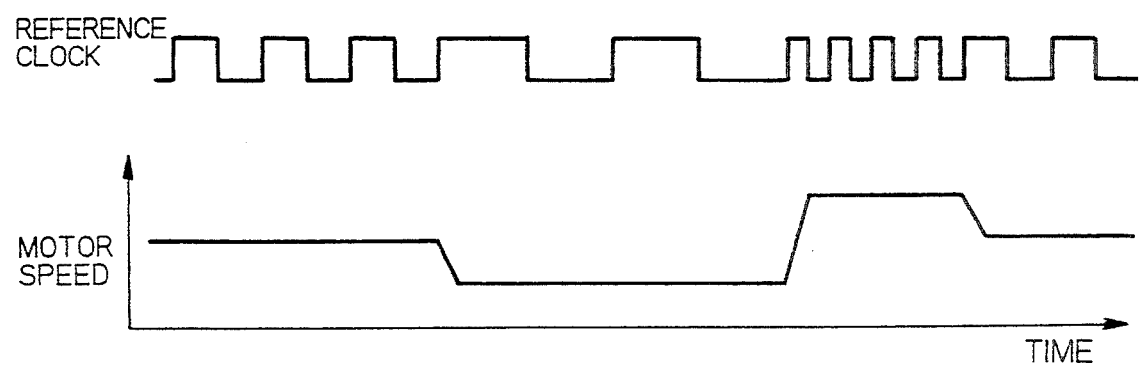
FIG. 21 is a timing chart showing motor drive control available with the arrangement of FIG. 20.

This embodiment is characterized in that the frequency divider of any of the first to fourth embodiments is used to control a motor. Specifically, this embodiment may be used to generate a reference clock for a motor which generates a rotation speed proportional to the frequency of a clock input from the outside. As shown in FIG. 20, a reference clock frequency divider 31 is connected to a motor 32. With this embodiment, it is possible to change the frequency division ratio or period of the reference clock, by changing the set values of the frequency divider 31. FIG. 21 shows a relation between the reference clock and the motor rotation speed. In FIG. 21, the ordinate indicates the reference clock and motor speed while the abscissa indicates time. As shown, when the frequency division ratio of the reference clock is changed, the motor speed changes accordingly.

In summary, it will be seen that the present invention provides a reference clock frequency divider having various unprecedented advantages, as enumerated below.

(1) The frequency divider has a counter for dividing the frequency of a reference clock by a ratio determined by a first set value and a fill-up signal, and a fill-up signal generator for changing the count of the counter on the basis of a second and a third set value. Hence, by changing the first, second and third set values, it is possible to change the frequency division ratio by the same circuitry. Moreover, by changing the count on the basis of the second and third values and combining the resulting counts, it is possible to generate frequency division ratios including apparent decimal ratios.

(2) The fill-up signal generator uses two different algorithms. One of them subtracts the second set value from a calculated value whose initial value is zero every time a frequency divided is applied to the signal generator, generate, if the result of the previous calculation is negative, a fill-up signal and adds the third set value to the result of subtraction, and then awaits the next frequency divided clock. The other algorithm does not generate the fill-up signal if the result of the previous calculation is equal to or greater than zero, and then awaits the next frequency divided clock. In this way, the algorithms for arithmetic operation is simplified. Moreover, since the result of operation has the same value at a predetermined period, the fill-up signal appears periodically. This successfully provides the resulting clock with an uniform frequency division ratio and allows desired frequency division ratios, including decimal ratios, to be set as accurately as possible.

(3) When the fill-up signal generator performs arithmetic operations with an adder, use is made of two different algorithms. One of them adds the second set value to a calculated value whose initial value is zero every time a frequency divided clock is input to the signal generator, generates, if the result of the previous calculation is smaller than a preselected value and the adder does not output a carry signal, a fill-up signal and adds the third set value to the result of addition, and then awaits the next frequency divided clock. The other algorithm does not generate the fill-up signal if the result of the previous calculation is greater than the predetermined value an d the adder generates a carry signal, and then awaits the next frequency divided signal. The adder, implementing the basic arithmetic algorithm of the frequency divider, promotes the easy arithmetic operations of the circuitry.

(4) The set values are divided in integral multiples of the number of bits of the adder. A selector sequentially performs arithmetic operations with the set values, and the results of such operations are sequentially written to a register. Hence, use can be made of an adder having a smaller number of bits than the set values, scaling down the adder.

(5) Detection signals appearing periodically relative to the output clock of the frequency divider are counted. Hence, a desired value can be counted by a small number of bits, compared to the case wherein the output clock pulses of the frequency divider are counted up to the desired value.

(6) When implemented as a motor drive control device, the frequency divider allows a person to control the clock frequency on which the rotation of a motor is based. Hence, the motor rotation can be sensed without resorting to extra means. Since the output frequency of the frequency divider is variable, the frequency of the output clock can be lowered while the motor is rotated at low speed, thereby reducing power consumption.

Various modifications will become possible for those skilled in the art after receiving the teachings of the present disclosure without departing from the scope thereof.

What is claimed is:

1. A reference clock frequency divider for dividing a frequency of a reference clock on the basis of set values to thereby generate a frequency divided clock pulse, comprising:
    a counter for outputting the frequency divided clock pulse in response to a first set value and a fill-up signal; and
    fill-up signal generating means responsive to the frequency divided clock pulse and a second and a third set value for performing an arithmetic operation based on said second and third set values every time said frequency divided clock pulse appears, and for generating said fill-up signal in accordance with a result of said arithmetic operation;
    said counter dividing, when said fill-up signal generating means does not generate the fill-up signal, the frequency of the reference clock by said first set value or dividing, when said fill-up signal generating means generates said fill-up signal, said frequency of said reference clock by a value produced by adding 1 (one) to said first set value.

2. A frequency divider as claimed in claim 1, wherein said fill-up signal generating means uses an arithmetic algorithm comprising:
    a first algorithm for subtracting, every time the frequency divided clock pulse is input to said fill-up signal generating means, said second set value from a calculated value whose initial value is 0 (zero), generating, when a result of a previous calculation is negative, generating the fill-up signal and adding said third set value to a result of subtraction, and then awaiting a next frequency divided clock; and
    a second algorithm for not generating the fill-up signal if the result of the previous calculation is equal to or greater than 0, and then awaiting the next frequency divided clock.

3. A frequency divider as claimed in claim 2, wherein an arithmetic operation based on said arithmetic algorithm is repeated, so that the result of calculation has a same value in every certain calculation period.

4. A frequency divider as claimed in claim 3, further comprising monitoring means for determining how many times the calculation has been repeated or how many times said calculated value has a predetermined value.

5. A frequency divider as claimed in claim 1, wherein said fill-up signal generating means comprises an adder.

6. A frequency divider as claimed in claim 5, wherein said adder uses an arithmetic algorithm comprising:
    a first algorithm which adds, every time the frequency divided clock pulse arrives, said second set value to a calculated value whose initial value is 0, generates, when the result of a previous addition is smaller than a predetermined value and said adder does not generate a carry signal, the fill-up signal and adds said third set value to said calculated value after addition, and then awaits a next frequency divided clock pulse; and
    a second algorithm which does not generate the fill-up signal when the result of addition is greater than the predetermined value and said adder generates the carry signal, and then awaits the next frequency divided clock.

7. A frequency divider as claimed in claim 6, wherein an arithmetic operation based on said arithmetic algorithm is repeated, so that the result of calculation has a same value in every certain calculation period.

8. A frequency divider as claimed in claim 7, further comprising monitoring means for determining how many times the calculation has been repeated or how many times said calculated value has a predetermined value.

9. A frequency divider as claimed in claim 1, wherein said fill-up signal generating means comprises:
    an adder for adding said second and third set values every time the frequency divided clock pulse appears;
    a first group of registers for storing said second and third set values and said calculated value which are divided into a plurality of groups on the basis of a number of bits of said adder;
    a selector for sequentially selecting one of said first group of registers for thereby outputting said set values to said adder; and
    a second group of registers equal in number to said first group of registers and for storing the result of arithmetic operation of said adder.

* * * * *